United States Patent
Lin et al.

(10) Patent No.: US 6,742,532 B2
(45) Date of Patent: Jun. 1, 2004

(54) CLEANING CONTAINER AND METHOD FOR CLEANING LP FURNACE THERMOCOUPLE SLEEVES

(75) Inventors: Yung-Pin Lin, Taichung (TW); Chung-Ray Chen, Chu-Bei (TW); Chen-Mei Fan, Hsin Chu Hsien (TW); Chan-Chung Shu, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 204 days.

(21) Appl. No.: 10/043,859

(22) Filed: Jan. 9, 2002

(65) Prior Publication Data

US 2003/0127114 A1 Jul. 10, 2003

(51) Int. Cl.[7] .................................................. B08B 3/04
(52) U.S. Cl. .................... 134/122 R; 134/133; 134/183; 134/186; 134/201
(58) Field of Search ........................... 134/64 R, 122 R, 134/133, 182, 183, 186, 200, 201

(56) References Cited

U.S. PATENT DOCUMENTS

| | | | | |
|---|---|---|---|---|
| 2,822,814 A | * | 2/1958 | Torkelson | |
| 2,965,111 A | * | 12/1960 | Feigelman | |
| 3,009,468 A | * | 11/1961 | Eberle | |
| 3,085,583 A | * | 4/1963 | Siek | |
| 3,696,457 A | * | 10/1972 | Hand | |
| 3,982,965 A | * | 9/1976 | Spotz | |
| 4,388,767 A | * | 6/1983 | Dison et al. | |
| 4,759,383 A | * | 7/1988 | Phillips | |
| 4,865,188 A | * | 9/1989 | Custeau | |
| 5,090,433 A | * | 2/1992 | Kamaga | |
| 5,201,331 A | * | 4/1993 | Tapper | |
| 5,320,119 A | * | 6/1994 | Griffiths | |
| 5,405,587 A | * | 4/1995 | Fernandez et al. | |
| 6,442,867 B2 | * | 9/2002 | Oressnall et al. | |

\* cited by examiner

Primary Examiner—Frankie L. Stinson
(74) Attorney, Agent, or Firm—Tung & Associates

(57) ABSTRACT

A cleaning container and method for using the same for chemically cleaning elongated members including quartz thermocouple sleeves including a first body member and a second body member said first body member and second body member respectively forming a first containing space and a second containing space including a first means for reversibly compressively sealing the first body member and the second body member to a form a combined containing space for sealably holding a cleaning solution level; a cap member disposed at a distal end of the first body member said cap member including a second means for reversibly compressively sealing a first opening in communication with the first containing space; and, a second opening centrally disposed in a distal end of the second containing space said second opening including a third means for reversibly compressively sealing around at least one elongated member penetrating through said second opening.

11 Claims, 2 Drawing Sheets

CLEANING CONTAINER AND METHOD FOR CLEANING LP FURNACE THERMOCOUPLE SLEEVES

FIELD OF THE INVENTION

This invention generally relates to preventative maintenance apparatus and methods in semiconductor processing and more particularly to a cleaning container and method for cleaning thermocouple sleeves used in LP furnaces.

BACKGROUND OF THE INVENTION

In semiconductor fabrication, various layers of insulating material, semiconducting material and conducting material are formed to produce a multilayer semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers are achieved using conventional fabrication techniques, such as oxidation, implantation, deposition, epitaxial growth of silicon, lithography, etching, and planarization.

In the semiconductor processing art there are several processes that require a thermal treatment at an elevated temperature under controlled ambient conditions. For example, low pressure (LP) furnaces that are capable of treating a batch of semiconductor wafers are used extensively including for example, to accelerate diffusion processes following implantation of a doping material in a semiconductor, for example, silicon semiconductor wafer. Other exemplary processes include high temperature oxidations (HTO), low temperature oxidations (LTO), and film-formation processing called low pressure chemical vapor deposition (LPCVD) for forming for example, metal nitride films and silicon oxide films derived from TEOS.

To accomplish such thermal treatments, for example, a vertically oriented LP furnace is frequently used for subjecting a batch of semiconductor wafers (process wafers) to a thermal treatment. The vertically oriented LP furnace is generally configured such that a quartz wafer boat holding wafers in multiple layers is conveyed into a vertical reaction vessel, usually from below, a lower aperture of the reaction vessel being closed hermetically by a lid member that supports the wafer boat.

For example, referring to FIG. 1A is shown a cross sectional representation shown of a portion of a vertically oriented LP furnace 10 with quartz wafer boat 12 having a cassette portion 12B for holding a plurality of wafers. Surrounding the wafer boat 12 is a cylindrical inner tube 14, for example, quartz that is ambiently sealed at the bottom portion of outer tube 16, again typically formed of quartz. Disposed in the annular space 20 between outer tube 16 and inner tube 14 is typically at least one thermocouple (TC) quartz sleeve e.g., 18, for holding a thermocouple wire junction to sense the temperature at the peripheral portion of the LP furnace. Quartz is a highly preferred material for forming furnace parts such as the wafer boat 12, the inner tube 14, outer tube 16, and TC sleeve 18. Quartz is a crystalline material with a high degree of purity and a high melting temperature thereby able to withstand thermal treatments while avoiding contamination of the process wafers. A lid member 22 supports the wafer boat 12 and typically is equipped with an O-ring for providing a hermetic seal. In operation, the wafer boat 12 holding a plurality of process wafers in cassette 12B is conveyed upward through a lower aperture 26 of the manifold 28 with lid member 22 forming a hermetic seal with manifold 28.

As a result of the critical need for a clean processing environment in semiconductor wafer processing, including the quartz furnace parts, for example, the wafer boat 12, the inner tube 14, outer tube 16, and TC sleeve 18, frequent shut down of the LP furnace operation is required to clean the quartz furnace parts as they tend to rapidly accumulate impurities from the various processing operations. In a typical semiconductor processing operation, several LP furnaces are in operation with the corresponding result that several may be shut down at one time for parallel preventive maintenance (PM) to improve the process wafer throughput and therefore the efficiency of the operation.

In a typical cleaning or PM operation where the quartz parts are cleaned a typical process flow chart is shown in FIG. 1B including one or more chemical solvent cleaning (soak) steps 102, using, for example hydrogen fluoride (HF) and optionally, a second chemical solvent for a total of for about 1 to about 3 hours. The chemical solvent treatment is followed by a deionized water (DIW) soak 104 for about 3 hours, a vertical DIW rinse 106 for about 1.5 hours, and a baking step 108 for about 2 hours for a total PM time period of about 7 to about 10 hours depending in part on the particular processes the LP furnace is dedicated to.

In a typical PM operation, the LP furnace parts are disassembled in the sequential order of removing the wafer boat 12, the inner tube 14, the TC sleeve 18, and the outer tube 16. The LP furnace parts are then subjected to a cleaning procedure carried out, preferably, in parallel according to the steps discussed. Following the cleaning procedure, the LP furnace parts are assembled in the sequential order of the outer tube, 16, the TC sleeve e.g., 18, the inner tube 14, and the wafer boat 12.

One problem with the prior art cleaning procedure is the cleaning process for the TC sleeves e.g., 18. According to the prior art cleaning process, only a limited number, for example two, TC sleeves are cleaned at a time due to the method used to protect the thermocouple wires from corrosive attack by the chemical cleaning solvent used, for example, HF. For example, the TC quartz sleeves including the TC wire and trailing TC wire extending through the sealed quartz sleeves are typically supported on a fork like fixture for automated dipping through the various cleaning steps. As a result, the trailing TC wire must be maintained above the level of the cleaning solvent, for example, tied to the fork like fixture via a cable tie, presenting the potential problems of loosening of the trailing TC to contact the cleaning solvent or contacting the cleaning solvent due to a high level of cleaning solvent contained in a container for dipping the TC sleeves. Furthermore, the due to the order of assembly, the limited number of TC sleeves that may be cleaned at one time creates a bottleneck effect, reducing overall throughput and efficiency.

There is therefore a need in the semiconductor processing art to develop an improved apparatus and method for cleaning the quartz TC sleeves to allow for a greater number of TC sleeves to be cleaned at one time without the danger of cleaning solvent attack of the associated TC wires.

It is therefore an object of the invention to provide an improved apparatus and method for cleaning the quartz TC sleeves to allow for a greater number of TC sleeves to be cleaned at one time without the danger of cleaning solvent attack of the associated TC wires while overcoming other shortcomings and deficiencies in the prior art.

SUMMARY OF THE INVENTION

To achieve the foregoing and other objects, and in accordance with the purposes of the present invention, as embodied and broadly described herein, the present invention provides a cleaning container for chemically cleaning elongated members.

In a first embodiment of the cleaning container, the cleaning container includes a first body member and a second body member said first body member and second body member respectively forming a first containing space and a second containing space including a first means for reversibly compressively sealing the first body member and the second body member to a form a combined containing space for sealably holding a cleaning solution level; a cap member disposed at a distal end of the first body member said cap member including a second means for reversibly compressively sealing a first opening in communication with the first containing space; and, a second opening centrally disposed in a distal end of the second containing space said second opening including a third means for reversibly compressively sealing around at least one elongated member penetrating through said second opening.

In related embodiments, the combined containing space forms a sealably closed hollow cylindrical shape. Further, the first, second and third means for reversibly compressively sealing include at least one of a threading means and a clamping means. Further, the threading means and the clamping means include a means for deformably compressing an O-ring to form a liquid tight seal. Further yet, an axial dimension of the sealably closed hollow cylindrical shape is greater than a radial dimension. Yet further, the axial dimension is sufficient to accommodate a length of the at least one elongated member to include at least one thermocouple sleeve.

In another embodiment, the second opening is a cylindrical opening of sufficient diameter to accommodate at one time a plurality of the at least one elongated member including about 6 to about 10 thermocouple sleeves.

In a further related embodiment, the third means for reversibly compressively sealing includes an inner compression sleeve and an outer compression sleeve for deformably compressing an O-ring to seal around the at least one elongated member to include at least one thermocouple sleeve.

In another embodiment, the at least one elongated member includes at least one thermocouple sleeve including a plurality thermocouple wires extending from the at least one thermocouple sleeve. Further, the cleaning solution level covers a height of the at least one elongated member to include at least one thermocouple sleeve.

In another embodiment, at least the combined containing space is formed of a chemically resistant material including a resistance to hydrofluoric acid (HF).

The present invention further provides a method for cleaning thermocouple sleeves including providing a plurality of thermocouple sleeves including a plurality of trailing thermocouple wires for cleaning; providing a cleaning container including at least a first sealing means such that at least a portion of each of the plurality of thermocouple sleeves sealably penetrates through the cleaning container to contact a cleaning solution contained in said cleaning container; and, sealably penetrating the cleaning container with the plurality of thermocouple sleeves to form a plurality of sealably penetrating portions of the plurality of thermocouple sleeves; and providing the cleaning solution contained in the cleaning container to clean the plurality of thermocouple sleeves.

In related embodiments, the step of sealably penetrating includes the at least a first sealing means forming a liquid tight seal around the plurality of trailing thermocouple wires. Further, the cleaning container includes a second sealing means whereby the cleaning container may be separated into 2 containing parts said second sealing means forming a liquid tight seal at a mating interface of the 2 containing parts. Further yet, at least one of the 2 containing parts is sized to contain a cleaning solution level for covering the plurality of the sealably penetrating portions.

In another embodiment, the plurality of thermocouple sleeves includes a plurality of from about 4 to about 10.

In other related embodiments, the cleaning solution includes at least hydrofluoric acid (HF). Further, at least a containing portion of the cleaning container includes a corrosion resistant material including a resistance to hydrofluoric acid (HF). Further yet, the corrosion resistant material includes at least one of polyethylene and polypropylene.

In another embodiment, the cleaning container includes a sealable cap at an end of the container distal from the at least a first sealing means for adding and removing a cleaning solution.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

It will be appreciated that the apparatus according to the present invention although explained in operation for cleaning a plurality of quartz thermocouple (TC) sleeves may be used in any cleaning procedure where it may be advantageous to clean all or a portion of an elongated member while protecting a remaining portion of an elongated member including trailing wires from contact with a cleaning solution, and further, that one or a plurality of elongated members may be cleaned with the cleaning container according to the present invention.

Figure 1A:
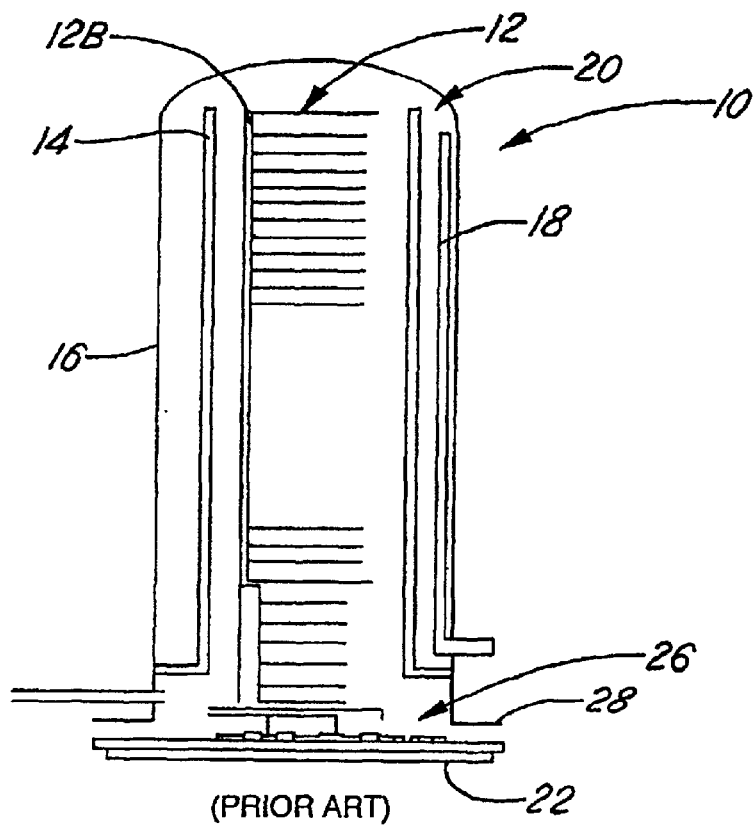
FIG. 1A is a cross sectional side view representation of a portion of a vertical LP furnace having quartz parts including thermocouple quartz sleeves according to the prior art.
Figure 1B:
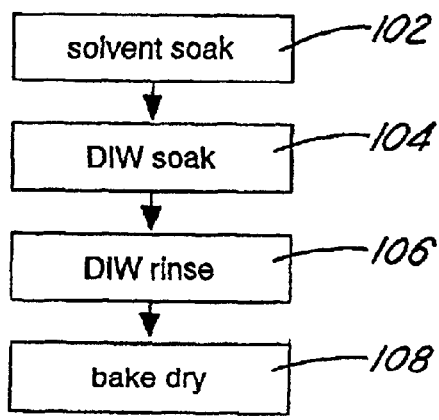
FIG. 1B is a process flow diagram for cleaning LP furnace quartz parts according to the prior art.
Figure 2:
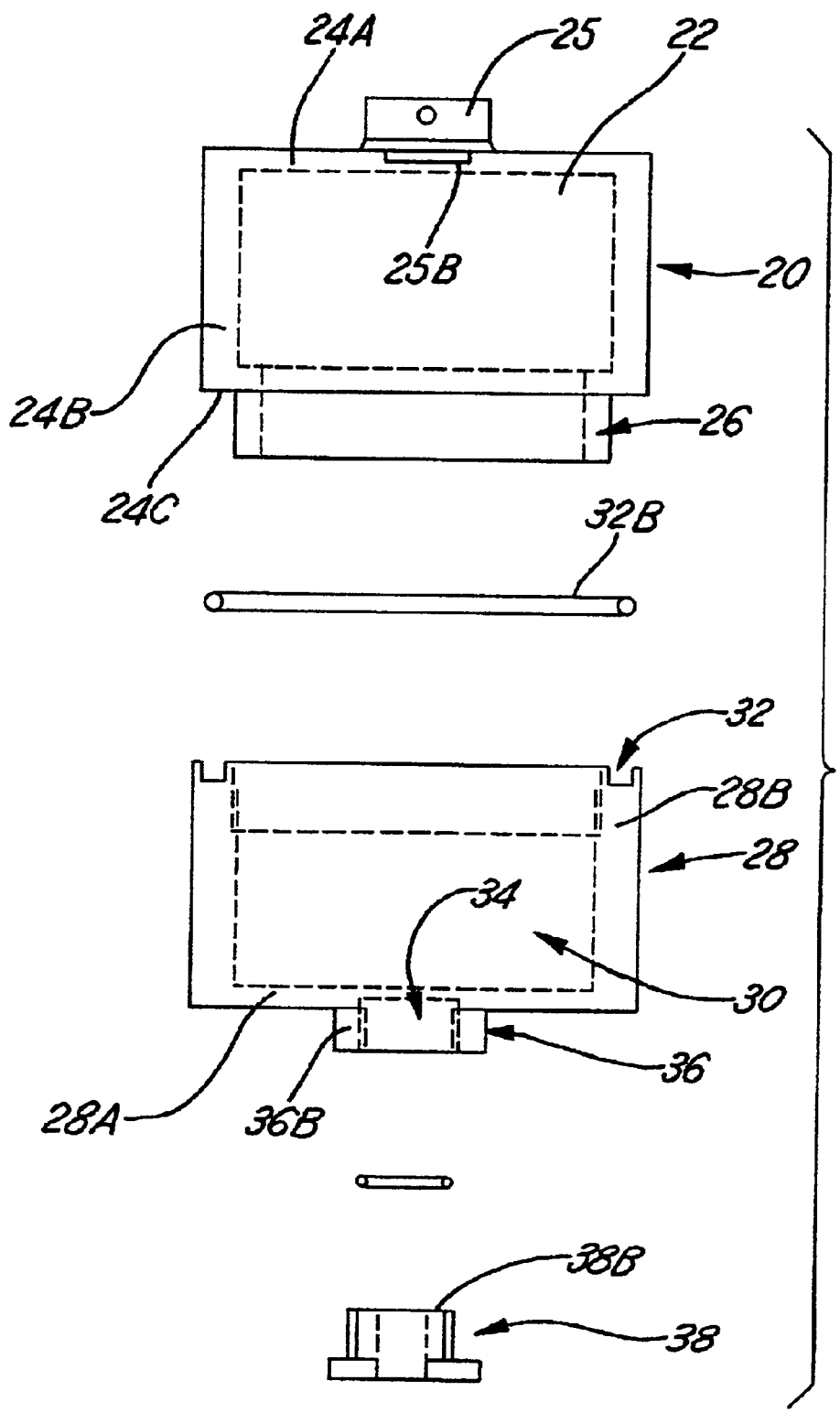
FIG. 2 is a cross sectional expanded view representation of the cleaning container according to the present invention.

Referring to FIG. 2, is shown one embodiment of the present invention of a TC cleaning container including a first body member 20, preferably an hollow cylindrical shape (annulus) having a first outer diameter and a first inner diameter to form a cylindrical containing space 22 closed at a first end by cylindrical end member 24A and having cylindrical wall member 24B. A cap member 25 with opening 25B communicating with containing space 22 may optionally be included in end member 24A, for example, with a threadable means and a compressively reversible liquid sealing means, for example, a cap sealing O-ring included therein. Disposed at a second end of first body member 20 is an inner sleeve member 26, also preferably forming a hollow cylindrical shape, having a second inner diameter and a second outer diameter smaller than the first outer diameter and first inner diameter respectively, forming a cylindrical sleeve (inner sleeve member 26) for reversibly compressively fitting, for example, slidably or threadably, into a second body member 28 to form a liquid tight seal. Second body member 28 likewise forms a hollow cylindrical shape having a first inner diameter to slidably or threadably accept inner sleeve member 26. Preferably, second body member has a first outer diameter matching that of first body member 20 to form hollow cylindrical wall member 28B and with a cylindrical end member 28A at a first end forming containing space 30. It will be appreciated that second body member 28, but may optionally have an outer diameter larger than first body member 20.

Formed in the surface of cylindrical wall member 28B at the slidably or threadably accepting end (second end) of second body member 28, the face of wall member 28B includes a trench 32 for holding a body sealing O-ring 32B which seals against the face 24C of wall member 24B when body member 20 and body member 28 are fitted together. It will be appreciated that the O-ring trench 32 may optionally be included in the face 24C of wall member 24B of first body member 20. Second body member 28 and first body member 20 may be fitted together and compressed to form liquid tight seal a their respective mating interfaces by conventional means including a clamping means with a clamping flange disposed around the mating surfaces of wall member 24B and wall member 28B at the outer diameter of slidably fitted first body member 20 and second body member 28. Alternatively, the liquid tight seal may be formed by a threading means where first body member 20 and second body member 28 are equipped with conventional threading means for threadably fitting first body member 20 including sleeve member 26 into second body member 28 to compress body sealing O-ring 32B against the mating surface 24C of wall member 24B.

Formed through cylindrical end member 28A is a feed through opening 34, preferably cylindrical, for accepting a plurality of elongated members (not shown). It will be appreciated that the diameter of the opening 34 will depend on the overall diameter of the number of elongated members, for example quartz TC sleeves, desired to be fed through the feed through opening 34; for example, in an exemplary embodiment the diameter may range from about 0.5 cm to about 2.0 cm, to accept, for example, 8 quartz TC sleeves.

Formed adjacent to and surrounding feed through opening 34 on an outer portion of end member 28A is a reversibly compressible sealing means for forming a liquid tight seal surrounding a portion of elongated members extending through the feed through opening 34, for example, trailing TC wires. For example, in one embodiment, an outer compression sleeve 36 having a hollow cylindrical shape centrally surrounds the feed through opening 34 forming cylindrical wall members 36B.

Formed in the wall members 36B, for example, is a conventional compression O-ring seat (not shown) designed to force a compression O-ring, e.g., 38A toward a central axis of opening 34 when a compressive force is applied to the exposed surface of the compression O-ring 38A by, for example, inner compression sleeve 38. Inner compression sleeve 38 including outer compression sleeve 36 is equipped with means for reversibly compressively fitting, for example, slidably or threadably fitting, together the inner and outer compression sleeves, 36 and 38, to exert a compressive force on the compression O-ring 38A thereby forming a liquid tight seal around an elongated object penetrating through feed through opening 34. For example, inner sleeve 38, preferably forming a hollow cylindrical shape, has a compression surface 38B for contacting compression O-ring 38A seated in O-ring seat (not shown) such that the compression O-ring 38A is forced toward a central axis of the inner sleeve 38 to form a liquid tight seal around a portion of an elongated member penetrating feed through inner sleeve 38 and feed through opening 34.

Inner compression sleeve 38 and outer compression sleeve 36 may be optionally be compressively fitted together including convention clamping means disposed around an outer diameter of mating surfaces of the fitted outer compression sleeve 36 and inner sleeve 38. In operation, the clamping means is tightened such that a compressive force is delivered to the compression O-ring 38A to deformably displace the compression O-ring 38A toward a central axis of inner sleeve 38 thereby forming a liquid tight seal around elongated members passing through inner compression sleeve 38 and feed through opening 34. Alternatively, the inner and outer compression sleeves 36 and 38 may be equipped with conventional threading means thereby allowing the compression O-ring 38A to be compressed according to a threadable fit of inner and outer compression sleeves 36 and 38.

Preferably, the TC cleaning container according to the present invention, including the first body member 20 and second body member 28 are made from a readily machineable, chemically resistant material such as polypropylene or polyethylene. The O-rings, including the body sealing O-ring and the compression O-ring may be any conventional chemically resistant material with an appropriate deformability to form a liquid tight seal around axially penetrating elongated members, such as quartz thermocouple (TC) sleeves including trailing thermocouple (TC) wires.

In operation, for example, a plurality of elongated quartz TC sleeve members including trailing TC wires (not shown), for example, about 6 to about 10, are fed through feed through opening 34 into at least a portion of containing space 30 leaving trailing TC wires protruding through opening 34 along a central axis of outer compressive sleeve member 36. The inner compression sleeve member 38 including an appropriately sized O-ring is then arranged to surround the trailing TC wires and compressively fitted into outer compression sleeve member 36, deforming compression O-ring 38A to form a liquid tight seal around the trailing TC wires. The overall diameter of the plurality of trailing TC wires may, for example, be from about 0.25 cm to about 1.0 cm. First body member 20 is then compressively fitted into the second body member 28 over body sealing O-ring means to form a liquid tight seal at the mated surfaces of first body member 20 and second body member 28. The TC container is then filled with a cleaning solution through cap member 25 to at least partially fill second body member 28 and to cover at least a portion of a penetrating TC sleeve to include a length of a TC sleeve. In an exemplary embodiment, for example, the length of TC sleeves used in an LP furnace may be from about 100 cm to about 300 cm.

According to the present invention, a cleaning container and a method for cleaning thermocouple sleeves has been presented whereby problems present in the prior art apparatus and methods have been overcome including an increase in the efficiency of preventative maintenance cleaning by reducing the LP furnace downtime by providing an apparatus and method that enables a greater number of TC sleeves to be cleaned in parallel and by ensuring that TC trailing wires do not contact the cleaning solution thereby causing TC wire corrosion. Furthermore, the amount of cleaning solution is reduced by increasing the number of TC sleeves that are cleaned in parallel.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A cleaning container for chemically cleaning elongated members comprising:
   a first body member and a second body member said first body member and second body member respectively forming a first containing space and a second containing space including a first means for reversibly compressively sealing the first body member and the second body member to a form a combined containing space for sealably holding a cleaning solution level;
   a cap member disposed at a distal end of the first body member said cap member including a second means for reversibly compressively sealing a first opening in communication with the first containing space; and
   a second opening centrally disposed in a distal end of the second containing space said second opening including a third means for reversibly compressively sealing around at least one elongated member penetrating through said second opening.

2. The cleaning container of claim 1, wherein, the combined containing space forms a sealably closed hollow cylindrical shape.

3. The cleaning container of claim 2, wherein an axial dimension of the sealably closed hollow cylindrical shape is greater than a radial dimension.

4. The cleaning container of claim 2, wherein the axial dimension is sufficient to accommodate a length of the at least one elongated member to include at least one thermocouple sleeve.

5. The cleaning container of claim 1, wherein the first, second and third means for reversibly compressively sealing include at least one of a threading means and a clamping means.

6. The cleaning container of claim 5, wherein the threading means and the clamping means include a means for deformably compressing an O-ring to form a liquid tight seal.

7. The cleaning container of claim 1, wherein the second opening is a cylindrical opening of sufficient diameter to accommodate at one time a plurality of the at least one elongated member including about 6 to about 10 thermocouple sleeves.

8. The cleaning container of claim 1, wherein the third means for reversibly compressively sealing includes an inner compression sleeve and an outer compression sleeve for deformably compressing an O-ring to seal around the at least one elongated member to include at least one thermocouple sleeve.

9. The cleaning container of claim 1, wherein the at least one elongated member includes at least one thermocouple sleeve including a plurality thermocouple wires extending from the at least one thermocouple sleeve.

10. The cleaning container of claim 1, wherein the cleaning solution level covers a height of the at least one elongated member to include at least one thermocouple sleeve.

11. The cleaning container of claim 1, wherein at least the combined containing space is formed of a chemically resistant material including a resistance to hydrofluoric acid (HF).

* * * * *